US009929722B1

(12) United States Patent
Friend et al.

(10) Patent No.: US 9,929,722 B1
(45) Date of Patent: Mar. 27, 2018

(54) WIRE CAPACITOR FOR TRANSMITTING AC SIGNALS

(71) Applicant: International Business Machines Corporation, Armonk, NY (US)

(72) Inventors: David M. Friend, Stewartville, MN (US); Grant P. Kesselring, Rochester, MN (US); Christopher W. Steffen, Rochester, MN (US); James D. Strom, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/419,236

(22) Filed: Jan. 30, 2017

(51) Int. Cl.
  *H03L 7/06* (2006.01)
  *H03K 3/037* (2006.01)
  *H01L 23/66* (2006.01)
  *H01L 23/522* (2006.01)
  *H01L 23/528* (2006.01)
  *H03L 7/099* (2006.01)

(52) U.S. Cl.
  CPC .......... *H03K 3/037* (2013.01); *H01L 23/528* (2013.01); *H01L 23/5223* (2013.01); *H01L 23/5226* (2013.01); *H01L 23/66* (2013.01); *H03L 7/099* (2013.01); *H01L 2223/6611* (2013.01); *H01L 2223/6616* (2013.01); *H01L 2223/6627* (2013.01)

(58) Field of Classification Search
  USPC .................. 327/147–149, 156–158
  See application file for complete search history.

(56) References Cited

U.S. PATENT DOCUMENTS

| 6,387,775 B1 * | 5/2002 | Jang | H01L 28/60 257/E21.01 |
| 6,812,797 B1 * | 11/2004 | De Veirman | H03L 7/087 327/156 |
| 7,235,453 B2 * | 6/2007 | Kim | H01L 23/5223 257/306 |
| 7,327,011 B2 * | 2/2008 | Hudson | H01G 4/228 257/534 |

(Continued)

FOREIGN PATENT DOCUMENTS

| DE | 2335778 A1 | 2/1975 |
| JP | 11150405 A | 6/1999 |

OTHER PUBLICATIONS

"Reliable Detection of Single Wire Breaks in a Balanced Transmission Line System" IBM TDB 10-81, p. 2568, IPCOM000053674D, Feb. 12, 2005.

*Primary Examiner* — Adam Houston
(74) *Attorney, Agent, or Firm* — Patterson + Sheridan, LLP

(57) ABSTRACT

Embodiments herein describe a transmission line used to carry an AC signal (e.g., a high-speed clock signal) between two different voltage domains in an IC. Instead of dividing the transmission line into multiple segments each with a buffer, in one embodiment the transmission line is arranged to form a capacitor. That is, the conductive material forming the transmission line is arranged in the IC to result in a desired capacitance. This capacitance can be used to replace a discrete capacitor that would otherwise be used with a buffer (e.g., level shifter) located at the end of the transmission line for converting the AC signal from a first voltage domain to a second voltage domain.

20 Claims, 7 Drawing Sheets

(56) References Cited

U.S. PATENT DOCUMENTS

| | | | |
|---|---|---|---|
| 7,469,199 B2 * | 12/2008 | Douriet | G01R 19/16552 702/188 |
| 7,639,474 B1 * | 12/2009 | Chen | H01G 4/228 361/301.4 |
| 7,671,689 B2 * | 3/2010 | Deng | H03B 5/1215 331/117 FE |
| 7,881,041 B1 * | 2/2011 | Chen | H01G 4/005 361/306.1 |
| 8,207,794 B2 * | 6/2012 | Lee | H03L 7/085 331/11 |
| 8,217,734 B2 | 7/2012 | Peyton et al. | |
| 8,395,200 B2 * | 3/2013 | Chen | H01L 23/5223 257/306 |
| 8,665,030 B2 * | 3/2014 | Lu | H03B 5/1228 331/117 FE |
| 9,035,708 B2 * | 5/2015 | Sun | H03B 5/24 331/117 FE |
| 9,300,306 B2 * | 3/2016 | Nakamura | H03L 7/02 |
| 9,698,808 B1 * | 7/2017 | Meninger | H03L 7/00 |
| 2003/0030475 A1 * | 2/2003 | Ishikawa | H03L 7/07 327/291 |
| 2005/0242890 A1 * | 11/2005 | Wu | H03L 7/087 331/18 |
| 2006/0013331 A1 * | 1/2006 | Choi | H04L 5/20 375/288 |
| 2008/0122670 A1 * | 5/2008 | Klaassen | H03M 1/0612 341/144 |
| 2008/0270818 A1 * | 10/2008 | Joordens | G06F 1/10 713/500 |
| 2009/0002905 A1 * | 1/2009 | Ramakrishna | H03K 19/00315 361/90 |
| 2009/0184771 A1 * | 7/2009 | Barton | H03L 7/0991 331/18 |
| 2009/0212431 A1 * | 8/2009 | Chen | H01L 21/76895 257/750 |
| 2010/0277250 A1 * | 11/2010 | Aga | H03B 5/1228 331/117 R |
| 2012/0176169 A1 * | 7/2012 | Sinha | H03L 7/1075 327/156 |
| 2012/0249250 A1 * | 10/2012 | Cheng | H03B 27/00 331/45 |
| 2013/0002317 A1 * | 1/2013 | Frantzeskakis | H03L 7/18 327/156 |
| 2014/0077892 A1 * | 3/2014 | Trotta | G05F 1/46 331/186 |
| 2015/0221592 A1 * | 8/2015 | Verma | H01L 24/49 257/773 |

* cited by examiner

WIRE CAPACITOR FOR TRANSMITTING AC SIGNALS

BACKGROUND

The present invention relates to arranging a signal line in an integrated circuit (IC) to yield a desired capacitance.

An IC may use long transmission lines (e.g., greater than ten microns) to transmit clock signals to different areas in the chip. When doing so, the transmission line may cross into different voltage domains in the IC which may introduce distortion into the clock signal—e.g., duty cycle distortion or jitter. Moreover, because of the length of the transmission line, the IC may need to divide the transmission line into smaller segments where each segment has a buffer for removing distortion and transmitting the clock signal along the next segment. For example, for a 100 micron transmission line, the IC may have five buffers spaced evenly along the transmission line to retransmit the clock signal to the next buffer.

SUMMARY

One embodiment of the present disclosure is an integrated circuit that includes a clock generator comprising an oscillator coupled to an inductor where the oscillator is configured to output a first signal and a second signal of a differential clock. The integrated circuit also includes a buffer and a transmission line configured to transmit the differential clock from the oscillator to the buffer. The transmission line includes a first wire coupled to the oscillator and the buffer where the first wire is configured to transmit the first signal and a second wire coupled to the oscillator and the buffer where the second wire is configured to transmit the second signal of the differential clock. The transmission line also includes a third wire coupled at respective ends to respective first vias where the respective first vias are coupled to the first wire and where the third wire is disposed in a different metal layer in the integrated circuit than the first wire. The transmission line also includes a fourth wire coupled at respective ends to respective second vias where the respective second vias are coupled to the second wire and where the fourth wire is disposed in a different metal layer in the integrated circuit than the second wire. Moreover, the first, second, third, and fourth wires are arranged in the integrated circuit to form a capacitor with a predefined capacitance value.

Another embodiment described herein is a circuit that includes a clock generator comprising an oscillator coupled to an inductor where the oscillator is configured to output a first signal and a second signal of a differential clock. The integrated circuit also includes a buffer and a transmission line configured to transmit the differential clock from the oscillator to the buffer. The transmission line includes a first wire coupled to the oscillator and the buffer where the first wire is configured to transmit the first signal and a second wire coupled to the oscillator and the buffer where the second wire is configured to transmit the second signal of the differential clock. The transmission line also includes a third wire coupled at respective ends to respective first vias where the respective first vias are coupled to the first wire and where the third wire is disposed in a different metal layer in the integrated circuit than the first wire. The transmission line also includes a fourth wire coupled at respective ends to respective second vias where the respective second vias are coupled to the second wire and where the fourth wire is disposed in a different metal layer in the integrated circuit than the second wire. Moreover, the first, second, third, and fourth wires are arranged in the integrated circuit to form a capacitor with a predefined capacitance value.

Another embodiment described herein is a processing system that includes a clock generator comprising an oscillator coupled to an inductor where the oscillator is configured to output a first signal and a second signal of a differential clock. The integrated circuit also includes a buffer and a transmission line configured to transmit the differential clock from the oscillator to the buffer. The transmission line includes a first wire coupled to the oscillator and the buffer where the first wire is configured to transmit the first signal and a second wire coupled to the oscillator and the buffer where the second wire is configured to transmit the second signal of the differential clock. The transmission line also includes a third wire coupled at respective ends to respective first vias where the respective first vias are coupled to the first wire and where the third wire is disposed in a different metal layer in the integrated circuit than the first wire. The transmission line also includes a fourth wire coupled at respective ends to respective second vias where the respective second vias are coupled to the second wire and where the fourth wire is disposed in a different metal layer in the integrated circuit than the second wire. Moreover, the first, second, third, and fourth wires are arranged in the integrated circuit to form a capacitor with a predefined capacitance value.

BRIEF DESCRIPTION OF THE SEVERAL VIEWS OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments herein describe a transmission line used to carry an AC signal (e.g., a high-speed clock signal) between two different voltage domains in an IC. Instead of dividing the transmission line into multiple segments each with a corresponding buffer, in one embodiment the transmission line is arranged to form a capacitor. That is, the conductive material forming the transmission line is arranged in the IC to result in a desired capacitance. This capacitance can be used to replace a discrete capacitor that would otherwise be used with a buffer (e.g., level shifter) located at the end of the transmission line for converting the AC signal from a first voltage domain to a second voltage domain. In one embodiment, forming the transmission line into a capacitor means the transmission line does not need to be subdivided into different segments using buffers.

In one embodiment, the transmission line capacitor is formed by disposing wires or traces on neighboring metal layers in the IC. If used for a high speed clock, the transmission line may include two wires for transmitting a differential clock signal (e.g., CLK+ and CLK− which has a 180 degree phase offset from CLK+). The differential clock signals may correspond to individual inputs into a buffer or level shifter. For example, the differential clock signal CLK+ is capacitively coupled to a BUF+ input while the clock signal CLK− is capacitively coupled to a BUF− input. The metal layers coupled to the CLK+ signal can be interleaved between metal layers coupled to the BUF+ input while the metal layers coupled to the CLK-signal are interleaved between metal layers coupled to the BUF− input. A designer can select the width of the wires as well as the number of metal layers to dispose the wires on in order to control or set the overall capacitance of the transmission line. For example, if greater capacitance is desired, the designer can interleave the CLK+ and BUF+ wires on additional metal layers in the IC or increase the width of the wires in order to increase the overall capacitance of the transmission line capacitor. In this manner, the structure of the transmission line capacitor can be altered to provide a desired capacitance for the level shifter or buffer disposed at the end of the transmission line.

Figure 1:
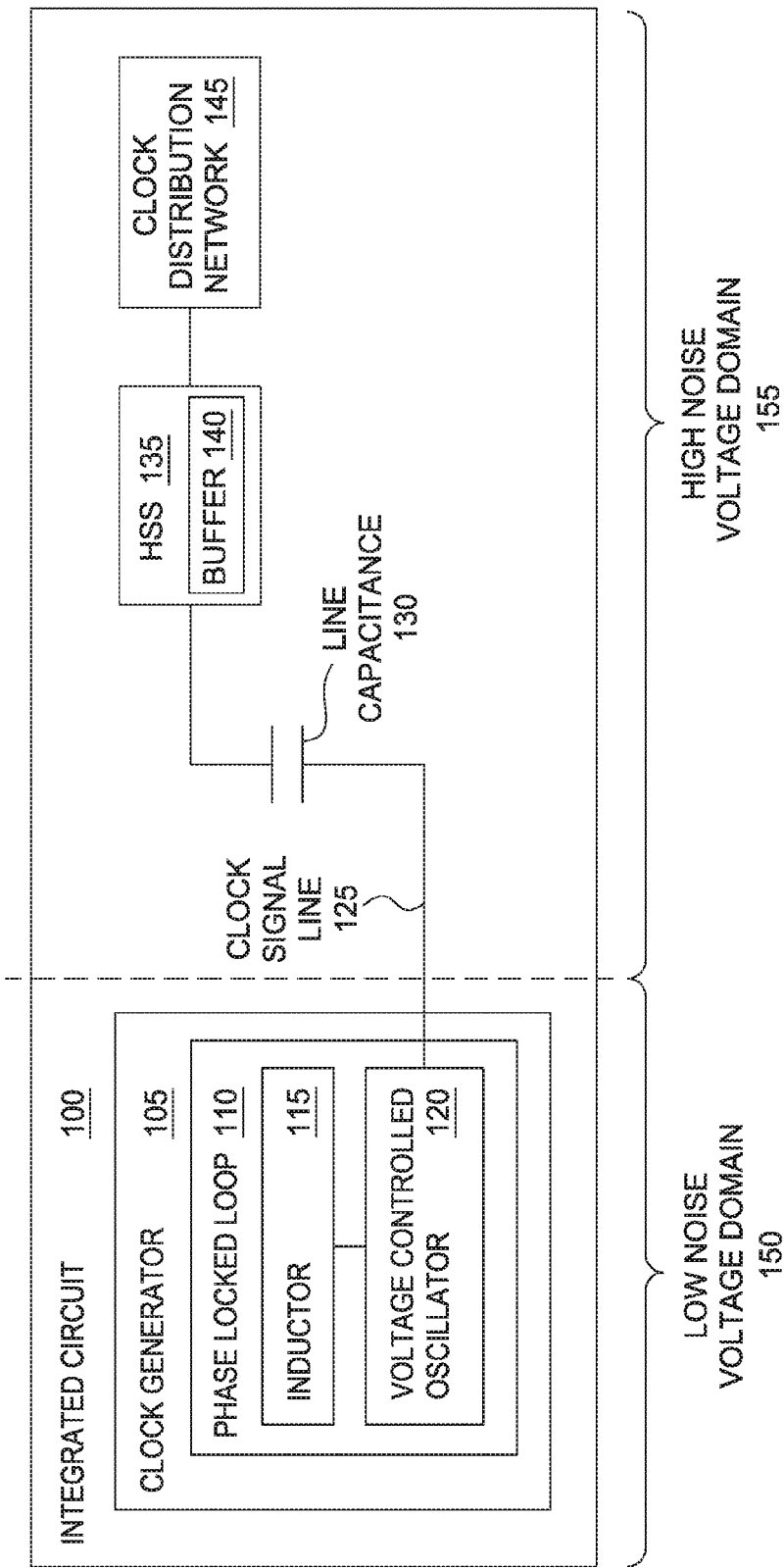
FIG. 1 illustrates an integrated circuit that includes a transmission line arranged to form a capacitor, according to one embodiment described herein.

FIG. 1 illustrates an IC 100 that includes a transmission line arranged to form a capacitor, according to one embodiment described herein. In this example, the transmission line is a clock signal line 125 which extends from a clock generator 105 to a high-speed SerDes (HSS) 135. As shown, the IC 100 is divided into two different voltage domains. In this example, the clock generator 105 is located in a low noise voltage domain 150 while the HSS 135 is disposed in a high noise voltage domain 155. It may be advantageous to generate the clock signal in the low noise voltage domain 150 (which may be have lower rail voltages than the high noise voltage domain 155) since this may result is a cleaner clock signal—e.g., less distortion.

The clock generator 105 includes a phase locked loop (PLL) 110 for generating the clock signal. As shown, the PLL 110 includes one or more inductors 115 coupled to a voltage controlled oscillator (VCO) 120. The VCO 120 uses the inductor 115 to generate the clock signal which is then driven onto the clock signal line 125. In one embodiment, the inductor 115 is a conductive coil formed using a conductive material in the IC 100.

Putting the inductor 115 in the low noise voltage domain 150 can be advantageous since the inductor 115 is sensitive to noise. For example, the inductor 115 may be isolated in the IC 100 such that no other metal layers are disposed over or below the inductor 115. As a result of this routing restriction, the designer may place the inductor 115 (and the other components in the clock generator 105) in a corner or non-central location in the IC 100. Although this means the clock signal generated using the inductor 115 has less distortion, it also means the clock signal may have to be routed longer distance in order to reach its destination—e.g., HSS 135. For example, the clock signal line 125 may have a length that ranges from 100 to 500 microns.

As AC signals (especially high-speed clock signals (e.g., 10+ GHz)) propagate on a transmission line, the signals can become distorted—e.g., duty cycle distortion and/or jitter. As such, a transmission line can be divided into segments where each segment includes a buffer for removing distortion and retransmitting the AC signal. As the length of the transmission line increases, more buffers may be used. However, in IC 100, the clock signal line 125 is not subdivided by buffers. Instead, even though the length of the line 125 may be 100 microns or greater, the line 125 does not need buffers in order to prevent distortion. Instead, as described in more detail below, the wires used to form the clock signal line 125 are disposed in multiple metal layers in the IC 100 to form the line capacitance 130. That is, the clock signal line 125 couples the VCO 120 to the HSS 135 via the line capacitance 130 such that there is no direct (e.g., ohmic) contact between these components. In this example, the VCO 120 and HSS 135 are coupled only capacitively.

The line capacitance 130 represents the total capacitance of the clock signal line 125 between the VCO 120 and the HSS 135. In one embodiment, the wires forming the clock signal line 125 are arranged to form a capacitor that has the desired line capacitance 130. In one embodiment, the line capacitance 130 is selected to prevent distortion in the clock signal as the signal is transmitted along the length of the clock signal line 125. The particular value of the line capacitance 130 can vary depending on the frequency of the differential clock.

Furthermore, the line capacitance 130 can be used with a buffer 140 (e.g., a level shifter) in the HSS 135. That is, instead of using a discrete capacitor (or capacitors) coupled between the end of the clock signal line 125 and the input of the buffer, this capacitor can be replaced by the line capacitance 130. Thus, by arranging the wires of the clock signal line 125 to form a capacitor, the IC 100 can avoid using buffers along the length of the line 125 as well as avoid using discrete capacitors in the buffer 140 which converts the clock signal from the voltage domain 150 into a clock signal for the voltage domain 155.

The IC 100 also includes a clock distribution network 145 coupled to the HSS 135. Once the clock signal generated by the clock generator 105 is converted into the voltage domain 155, the HSS 135 transmits the converted clock signal to other logic circuitry in the IC 100 which are also in the high noise voltage domain 155 using the clock distribution network 145. Moreover, although the embodiments herein describe arranging the transmission line for a clock signal into a capacitor, any transmission line used to transmit an AC signal can be used. In one embodiment, the IC 100 may be included in a processing system (e.g., one or more processors) for executing computing tasks.

Figure 2:
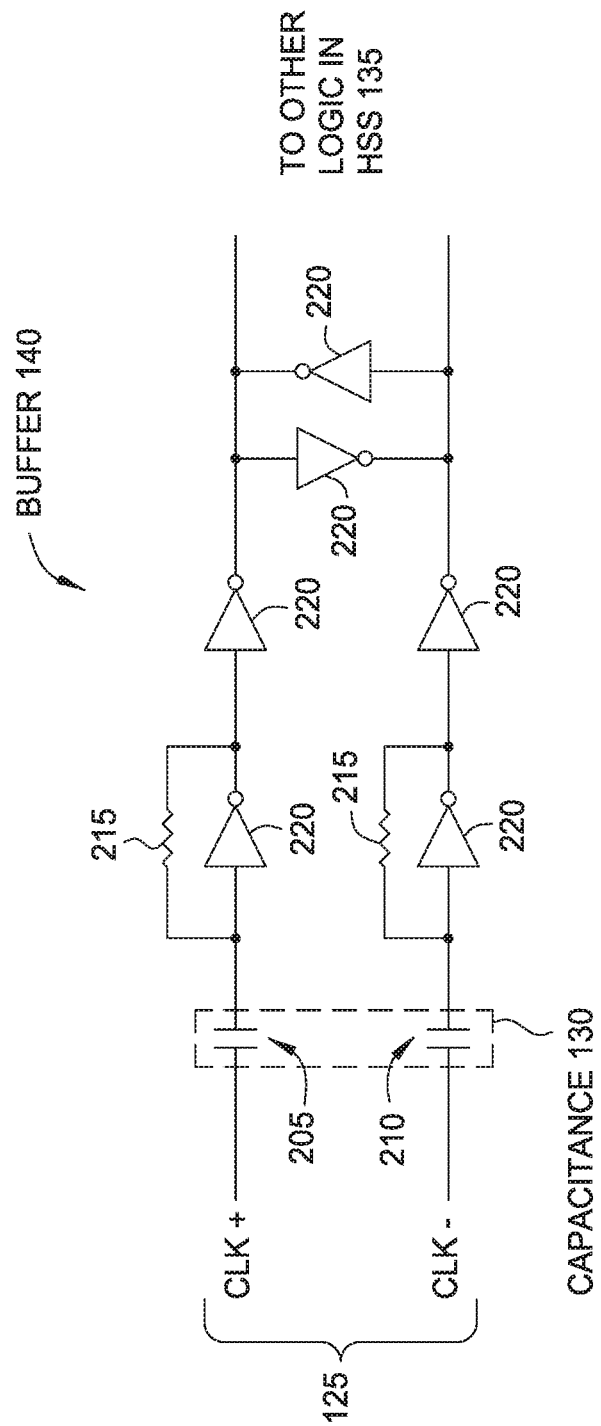
FIG. 2 illustrates a capacitor formed from a transmission line along with a buffer, according to one embodiment described herein.

FIG. 2 illustrates the capacitance 130 formed from a transmission line along with a buffer 140, according to one embodiment described herein. As shown, the clock signal line 125 is coupled to the buffer 140. In this example, the clock signal line 125 transmits a differential clock (e.g., CLK+ and CLK−) using two separate wires or traces. Each of the wires forms a respective capacitance 205 and 210 which, when combined, form the capacitance 130. That is, the wires for the CLK+ and CLK− signals are arranged to form the capacitance 130.

In this embodiment, the capacitances 205 and 210 are used by the buffer 140 to perform level shifting. That is, the buffer 140 includes resistors 215 and inverters 220 which convert the clock signal received on the line 125 from a first voltage domain to a second voltage domain. Level shifting the differential clock signal may rely on the capacitance 130 formed by the clock signal line 125. That is, the conductive material in the clock signal line 125 may be arranged to generate a minimum capacitance value—e.g., a capacitance 130 equal to or greater than 100 femtofarads. By arranging the clock signal line 125 to form the capacitors 205 and 210, discrete capacitors (e.g., gate oxide capacitors) can be avoided. Moreover, forming the capacitors 205 and 210 using the length of the clock signal line 125 has the added benefit of not requiring buffers to be intermittently disposed along the line 125 as discussed above.

The output of the buffer 140 is coupled to other logic within the HSS 135. This logic may be in a different voltage domain then the voltage domain in which the clock signal CLK+ and CLK− was generated. The buffer 140 converts the clock signal to the new voltage domain so that the clock signal can be used by the logic circuitry in the HSS 135.

Figure 3A:
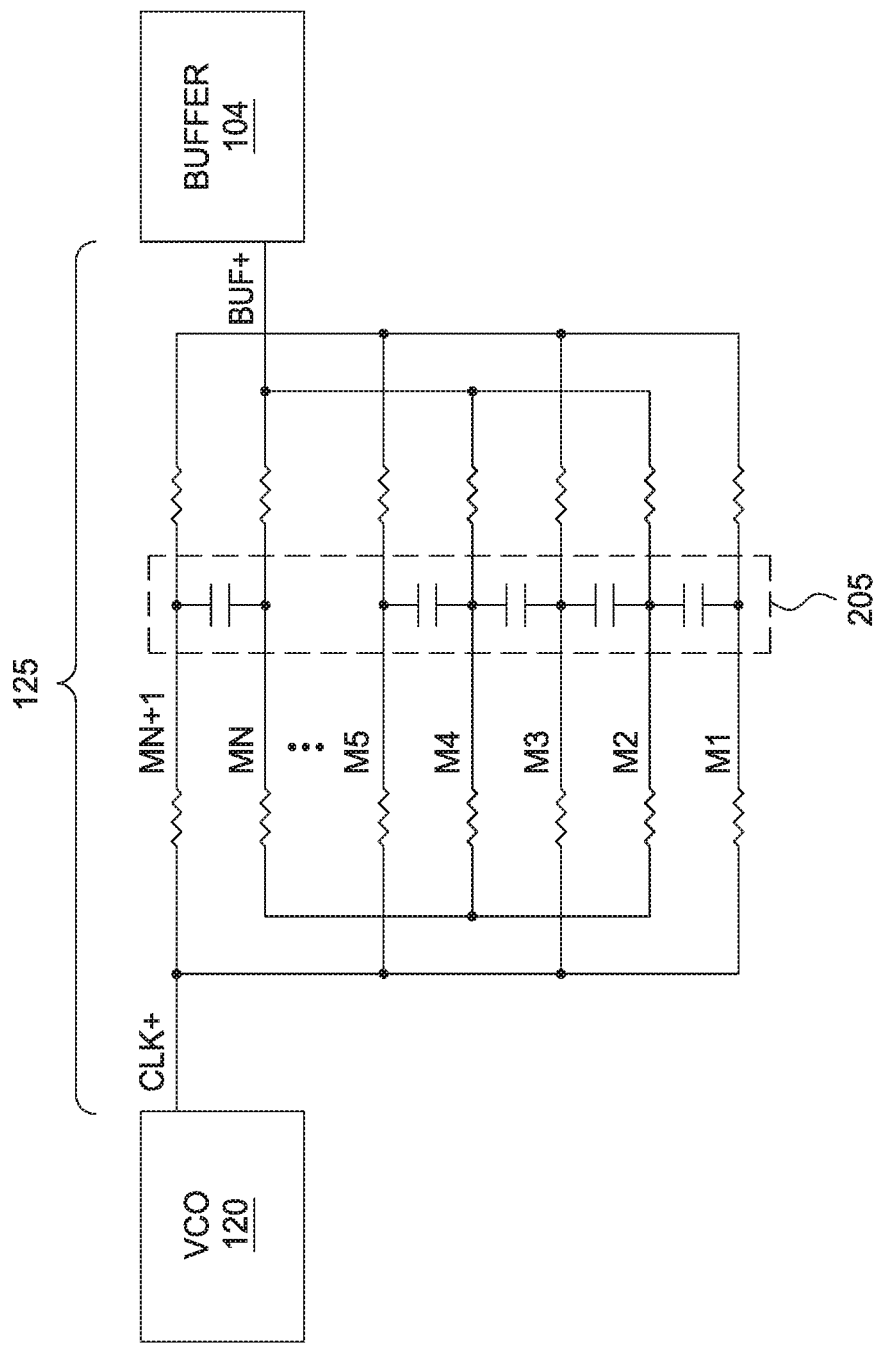
FIGS. 3A and 3B each illustrates arranging a transmission line on multiple metal layers in an IC to form a capacitor, according to one embodiment described herein.
Figure 3B:
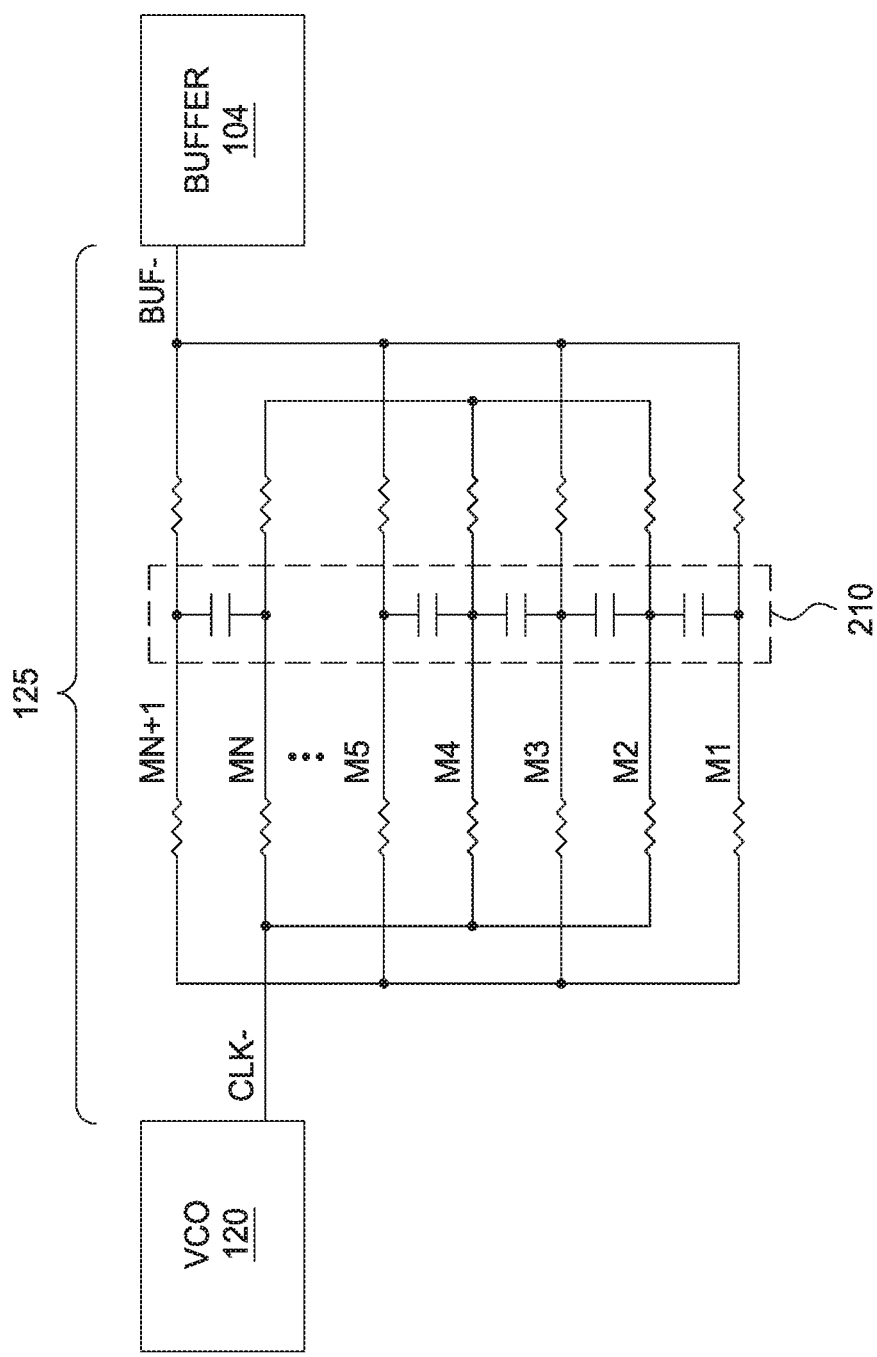

FIGS. 3A and 3B each illustrates arranging a transmission line on multiple metal layers in an IC to form a capacitor, according to one embodiment described herein. Specifically, FIG. 3A illustrates a model of a first portion of the clock signal line 125 that extends between the VCO 120 and the buffer 140 which transmits the CLK+ to the BUF+ input of the buffer 104. Because the line 125 is a model rather than a physical transmission line, the resistors and capacitors illustrated therein are not discrete components but rather representative of the inherent resistance and capacitance of the line 125. That is, the resistors in FIG. 3A represent the inherent resistance of the conductive material of the line 125. The resistor values change depending on the conductive material selected for forming the clock signal line 125 (e.g., gold, aluminum, copper, etc.).

The capacitors represent the capacitance between neighboring traces or wires in the clock signal line 125. As shown, the traces coupled to the CLK+ signal generated by the VCO 120 are interleaved with the traces coupled to the BUF+ input of the buffer 104. These traces are only capacitively coupled such that there is no direct electrical connection between the VCO 120 and the buffer 104.

In this example, the wires are deposited on neighboring metal layers or levels in the IC—e.g., layers M1 through MN+1. Depositing the wires on additional metal layers in the IC increases the overall or total capacitance 205 of the clock signal line 125. Similarly, increasing the width of the wires also increases the individual capacitance between the wires in the neighboring metal layers which increases the total capacitance 205. Depending on the line capacitance 205 desired, a system designer can alter the width of the wires as well as the number of metal layers in which the wires are disposed. In other embodiments, the designer can decrease the line capacitance 205 by placing the wires in non-neighboring metal layers. For example, the designer may place a metal layer between two of the wires. Instead of putting the bottom two wires in metal layers M1 and M2, the designer may shift the upper wires so that the bottom wire is metal layer M1 but the next wire is in metal layer M3, thereby decreasing the capacitive coupling between these two wires. Thus, the wires do not need to be disposed in neighboring (e.g., consecutive) metal layers.

Moreover, although FIG. 3A illustrates disposing the wires in a stacked, overlapping manner where each metal layer includes one of the wires, in other embodiments, the clock signal line 125 may include multiple wires disposed on the same metal layer. For example, a first wire carrying the CLK+ signal may be disposed on the same metal layer as a second wire coupled the BUF+ input. The first and second wires may be parallel to each other in the shared metal layer. Moreover, the line capacitance 205 may include the coupling capacitance between the first and second wires in the same metal layer. That is, the designer can dispose wires in parallel along the same metal layer to use the resulting coupling capacitance to set the total line capacitance 205 between the CLK+ output of the VCO 120 and the BUF+ input of the buffer 104.

FIG. 3B illustrates a similar arrangement as in FIG. 3A except for coupling the CLK− signal outputted by the VCO 120 to the BUF− input of the buffer 104. As shown, the traces coupled to the CLK− signal generated by the VCO 120 are interleaved with the traces coupled to the BUF− input of the buffer 104. These traces are only capacitively coupled such that there is no direct electrical connection between the VCO 120 and the buffer 104. Using the various techniques described above, a designer can alter the shape, position, location, and/or number, of the wires in order to achieve the desired capacitance 210. As shown in FIGS. 3A and 3B, a designer can set the respective capacitances 205 and 210 between the VCO 120 and the buffer 104 for the clock line 125.

Figure 4A:
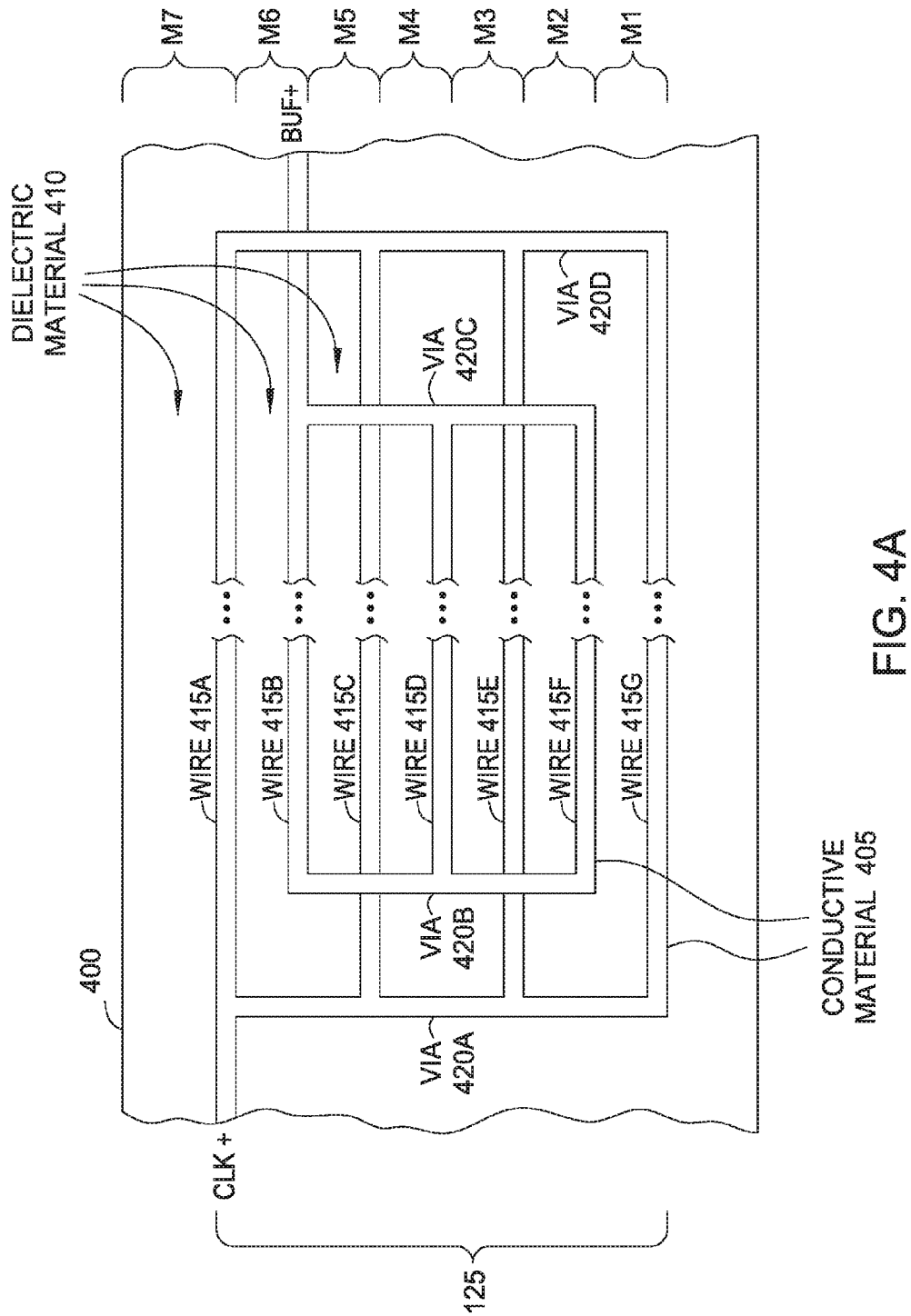
FIGS. 4A and 4B each illustrates arranging a transmission line on multiple metal layers in an IC to form a capacitor, according to one embodiment described herein.
Figure 4B:
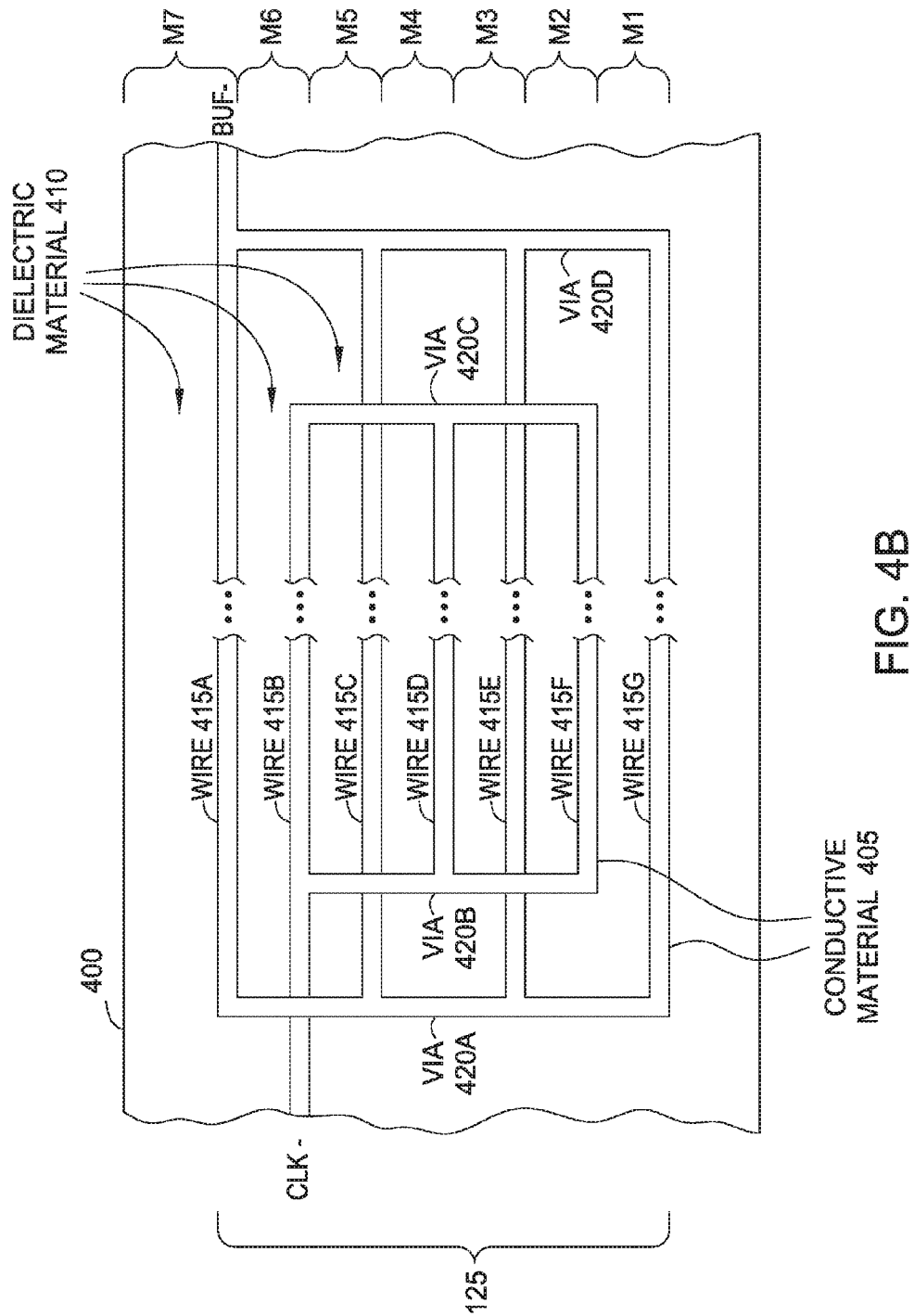

FIGS. 4A and 4B each illustrates arranging a transmission line on multiple metal layers in an IC 400 to form a capacitor, according to one embodiment described herein. The left side of the IC 400 illustrates the boundaries of the metal layers—i.e., layers M1-M7. Although not shown, the IC 400 can have additional metal layers below and/or above the wires 415 forming the clock signal line 125. That is, the IC 400 may include other circuitry or transmission lines disposed in the metal layers above or below the layers M1-M7.

In one embodiment, the left side of the line 125 is coupled to the CLK+ signal outputted by VCO while the right side couples to the BUF+ input of a buffer or level shifter. As shown, the CLK+ signal is transmitted on the wire 415A in metal layer M7 while the BUF+ input is coupled to the wire 415B in metal layer M6. In one embodiment, the wire 415A is directly coupled to the VCO while the wire 415B is directly coupled to the buffer. To route the clock CLK+ signal other layers, the IC 400 includes a via 420A coupled to the wire 415A. Similarly, the wire 415B (which is coupled to the BUF+ input) is coupled to a via 420B. As shown, the vias 420A and 420B extend vertically through the metal layers and provide electrical paths to couple the wires in different layers to the wires 415A and 415B. In this example, the wires 415C, 415E, and 415G in metal layers M5, M3, and M1 are coupled to via 420A, and thus, are electrically coupled to wire 415A. As such, the clock signal CLK+ is driven on these wires. On the other hand, the wires 415D and 415F are coupled to via 420B, and thus, to wire 415B. As such, the wires 415D and 415F are electrically coupled to the BUF+ input.

In the embodiment shown, the wires 415A-415G are, at least partially, overlapping each other in the vertical direction. However, this is not a requirement. Even if the wires 415 are offset such that the wires 415 are not directly overlapping, or only partially overlapping, the wires 415 can still be capacitively coupled which can be controlled to achieve a desired capacitance 130 for the clock signal line 125.

Some of the wires may be shifted in the metal layers in a direction into and out of the page in order to avoid the vias 420. For example, to prevent the clock signal CLK+ from being electrically connected to the BUF+ input, the wire 415B may be shifted into or out of the page along metal layer M6 to avoid the via 420D which cuts through layer M6. Similarly, the wires 415C and 415E may be shifted in their respective metal layers to avoid via 420B. In this manner, the wires 415A, 415C, 415E, and 415G which transmit clock signal CLK+ remain electrically insulated from wires 415B, 415D, and 415E which are coupled to the BUF+ input.

So that current flows through the wires 415C-G located in metal layers M1-M5, these wires are coupled to respective vias 420C and 420D which couple the opposite ends of the wires 415C-G to the top wires 415A and 415B. Using the vias 420A and 420D, the differential clock signal CLK+ can be routed on multiple metal layers in the IC 400 and be capacitively coupled to the wires 415B, 415D, and 415F that are electrically coupled to the BUF+ input. The length of the wires 415C-415G may vary. That is, these wires may extend along the entire length of the clock signal line 125 or for only a portion of the line 125.

As described above, the designer can alter the width and length of the wires 415 A-G in order to achieve the desired capacitance 130. In one embodiment, the wires 415A-G may form a serpentine shape to extend the length of the clock signal line 125 relative to a straight line path between the VCO and the HSS. Adding additional length to the line 125 can increase the capacitance 205. Further, although FIG. 4A illustrates a side view of the IC 400, the clock signal line 125 may include multiple wires disposed side-by-side in the same metal layer as described above.

In one embodiment, the wires in the clock signal line 125 may be separated to permit other traces or circuitry to be disposed in the metal layers. For example, when extending between the VCO and the HSS, the line 125 may cross another signal line running in a perpendicular direction. The designer may shift where the wires are disposed in the IC 400 to route the clock signal line 125 around the other signal line. For example, using vias, the top two wires 415A and 415B may be shifted to metal layers M8 and M9 to permit another signal to use metal layers M7 and M6. After passing around the other signal line, the IC 400 may include additional vias for moving the wires 415A and 415B back into metal layers M6 and M7.

The wires 415 and vias 420 are formed from conductive material 405 which can be any suitable electrical conductor. In one embodiment, the wires 415 may be made from a different conductive material than the vias 420. To prevent the wires 415 from short circuiting to each other (and to generate the capacitance between the wires 415), the IC 400 includes a dielectric material 410 (e.g., silicon dioxide) disposed between the wires 415 in the different metal layers. Moreover, the dielectric material 410 may be disposed between wires 415 that are in the same metal layer.

FIG. 4B has a similar arrangement as FIG. 4A except this portion of the IC 400 capacitively couples the differential clock signal CLK− to the BUF− input of the buffer or level shifter. For example, the wires and traces in FIG. 4A may be disposed side-by-side of the wire and traces in the FIG. 4B in the IC 400 as the clock line 125 extends between the VCO and the buffer.

In one embodiment, the left side of the line 125 is coupled to the CLK− signal outputted by VCO while the right side couples to the BUF− input of a buffer or level shifter. As shown, the CLK− signal is transmitted on the wire 415A in metal layer M7 while the BUF− input is coupled to the wire 415B in metal layer M6. In one embodiment, the wire 415A is directly coupled to the VCO while the wire 415B is directly coupled to the buffer. To route the clock CLK− signal other layers, the IC 400 includes the same via structures as shown in FIG. 4A. Similarly, the wire 415B (which is coupled to the BUF+ input) is coupled to the vias 420B and 420D. Moreover, the same techniques for adjusting, moving, or splitting the wires 415A-G as described in FIG. 4A can also be applied to the structure illustrated in FIG. 4B. By disposing the two structures illustrated in FIGS. 4A and 4B in the IC 400, the IC 400 can route a differential clock signal provided by a clock generator to respective input ports of a buffer without a direct electrical connection between the clock generator and the buffer.

Figure 5:
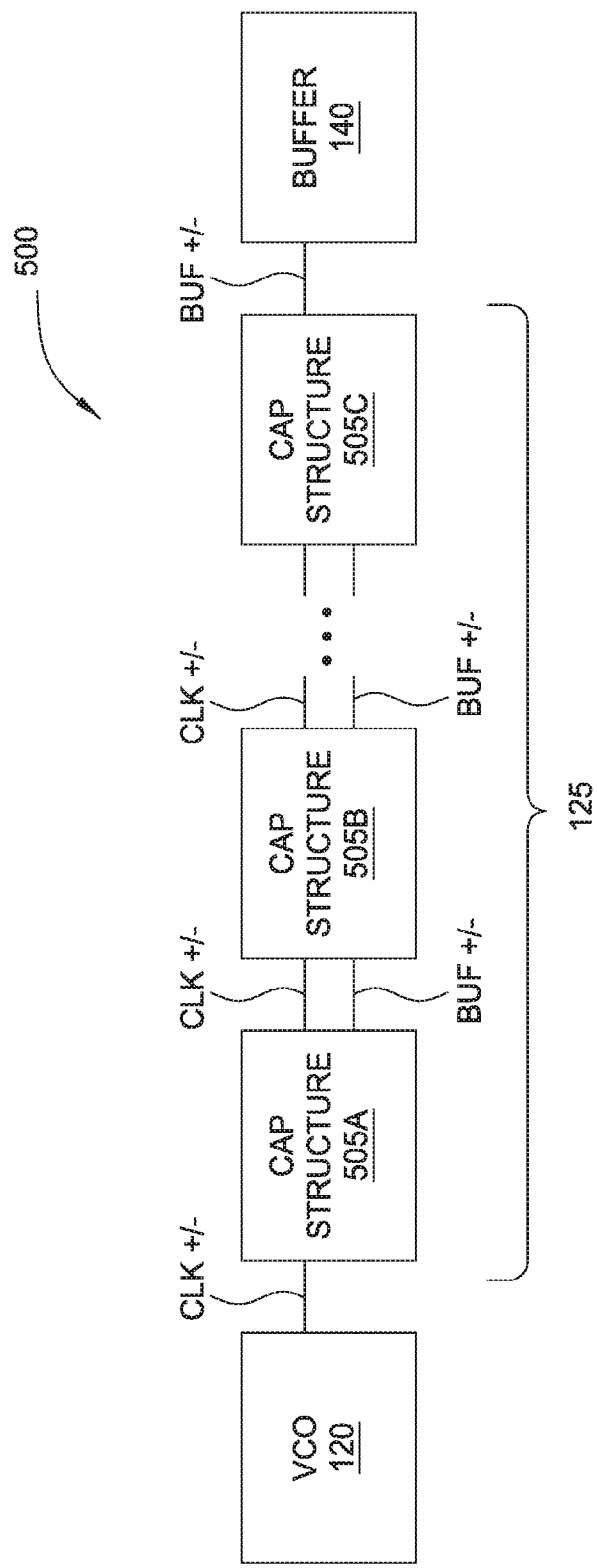
FIG. 5 illustrates coupling capacitive structures in series to form a transmission line with a desired capacitance, according to one embodiment described herein.

FIG. 5 illustrates a communication link 500 that includes capacitive structures 505 coupled in series to form a transmission line with a desired capacitance, according to one embodiment described herein. As shown, the VCO 120 is coupled to the buffer 140 using the plurality of connected capacitive structures 505. That is, either the CLK+ or the CLK− signal is outputted by the VCO 120 which is then received at either the BUF+ or BUF− input of the buffer 140. The combined capacitance for the capacitive structure 505 may generate either the line capacitance 205 or 210 illustrated in FIG. 2 depending on whether the communication link 500 is transmitting the CLK+ signal or the CLK− signal. Like above, the communication link 500 permits the line 125 to avoid buffers along its length as well as removing the discrete capacitors in the level shifter.

In one embodiment, the capacitive structure 505 may each have the same arrangement of wires for transmitting the differential clock signal. For example, each capacitive structure 505 may have the shape shown in FIGS. 4A and 4B where vias 420 are used to connect the two top wires 415A and 415B to a plurality of wires 415C-415G disposed in underlying metal layers. In this example, only the top two wires 415A and 415B may extend between the capacitive structures 505. That is, one wire transmits the CLK+ or CLK− signal while the other wire couples all the capacitive structures 505 to the BUF+ or BUF− input of buffer 140. Thus, in the areas of the line 125 between the capacitive structures 505, the line 125 may extend only in two of the metal layers (or only one of the metal layers if the two wires are disposed side-by-side on the same metal layer). Thus, the areas along the signal line 125 that do not include the capacitive structures 505—e.g., metal layers M1-M5—may be used to route other signal lines or to put in logic circuitry in the unused metal layers.

In another embodiment, the capacitive structures 505 may vary. For example, the capacitive structure 505A may be disposed in a location in the IC that has more available routing area than the capacitive structure 505C. That is, the capacitive structure 505A may be disposed in a portion of the IC that has less circuitry and other transmission lines than a portion of the IC that includes the capacitive structure 505C. As a result, the wires in the capacitive structure 505A may extend on more metal layers than the wires in the capacitive structure 505C. For example, the capacitive structure 505A may have wires coupled to the differential clock signal on eleven metal layers while the capacitive structure 505C may have wires only on five metal layers. However, although the arrangement of the wires in the capacitive structures 505A and 505C are different, their capacitances may be the same. For example, to compensate for having wires on few metal layers, the wires in the capacitive structure 505C may be wider than the wires in the capacitive structure 505A or the capacitive structure 505C may include additional wires disposed side-by-side on the metal layers. However, it is not a requirement that the capacitive structures 505 have the same capacitances but can have different individual capacitance values.

The arrangement of the wires in the capacitive structures 505 can be controlled to yield the desired line capacitance for the clock signal line 125. That is, even if the arrangements of the wires in the capacitive structures 505 are different, the designer can control the arrangements to achieve a particular total line capacitance. In one embodiment, the designer may control the arrangements of the capacitive structures 505 to achieve a minimum desired capacitance. The minimum desired capacitance may change depending on the speed of the signals driven on the transmission line. For example, for a clock signal speed of 29 GHz, the designer may want a line capacitance 205 or 210 of at least 100 femtofarads, although larger capacitances are also sufficient. Put differently, a transmission line with 100 femtofarads of capacitance may reduce the impedance of the transmission line below a predefined threshold when transmitting a 29 GHz clock signal such that buffer segments are not needed. If the capacitance is too small, distortion may be added to the clock signal as it propagates between the VCO 120 and the buffer 140.

In one embodiment, forming a capacitor with a predefined capacitance value using the transmission line between the VCO and HSS reduces jitter and duty cycle distortion relative to a transmission line that includes a plurality of segments separated by buffers. In one embodiment, implementing the embodiments herein can reduce the duty cycle distortion for a 29 GHz clock signal by 0.5 picoseconds and reduce the jitter by 0.33 picoseconds.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements described herein, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. An integrated circuit, comprising:
   a clock generator comprising an oscillator coupled to an inductor, wherein the oscillator is configured to output a first signal of a differential clock;
   a buffer; and
   a transmission line configured to transmit the first signal of the differential clock from the oscillator to the buffer, the transmission line comprising:
      a first wire coupled to the oscillator, wherein the first wire is configured to transmit the first signal,
      a second wire coupled to the buffer, wherein the second wire is configured to receive the first signal of the differential clock,
      a third wire coupled at respective ends to respective first vias, wherein the respective first vias are coupled to the first wire, and wherein the third wire is disposed in a different metal layer in the integrated circuit than the first wire, and
      a fourth wire coupled at respective ends to respective second vias, wherein the respective second vias are coupled to the second wire, and wherein the fourth wire is disposed in a different metal layer in the integrated circuit than the second wire,
   wherein the first, second, third, and fourth wires are arranged in the integrated circuit to form a first capacitor with a predefined capacitance value.

2. The integrated circuit of claim 1, wherein the transmission line does not include any buffers between an output of the oscillator and an input of the buffer, wherein a length of the transmission line is at least 100 microns, and wherein the buffer is only capacitively coupled to the clock generator.

3. The integrated circuit of claim 1, further comprising:
   a SerDes containing the buffer, wherein the buffer comprises a level shifter and wherein the clock generator is in a first voltage domain of the integrated circuit and the SerDes is in a second voltage domain of the integrated circuit, wherein the level shifter is configured to convert the differential clock from the first voltage domain to the second voltage domain.

4. The integrated circuit of claim 1, wherein the transmission line further comprises:
   a fifth wire coupled to the oscillator, wherein the fifth wire is configured to transmit a second signal of the differential clock signal generated by the oscillator,
   a sixth wire coupled to the buffer, wherein the sixth wire is configured to receive the second signal of the differential clock,
   a seventh wire coupled at respective ends to respective third vias, wherein the respective third vias are coupled to the fifth wire, and wherein the seventh wire is disposed in a different metal layer in the integrated circuit than the fifth wire, and
   an eighth wire coupled at respective ends to respective fourth vias, wherein the respective fourth vias are coupled to the sixth wire, and wherein the eighth wire is disposed in a different metal layer in the integrated circuit than the sixth wire,
   wherein the fifth, sixth, seventh, and eighth wires are arranged in the integrated circuit to form a second capacitor with the predefined capacitance value.

5. The integrated circuit of claim 1, wherein the transmission line further comprises:
   a first capacitive structure comprising the third and fourth wires; and
   a second capacitive structure comprising:
      a fifth wire coupled at respective ends to respective third vias, wherein the respective third vias are coupled to the first wire, and wherein the fifth wire is disposed in a different metal layer in the integrated circuit than the first wire; and
      a sixth wire coupled at respective ends to respective fourth vias, wherein the respective fourth vias are coupled to the second wire, and wherein the sixth wire is disposed in a different metal layer in the integrated circuit than the second wire, wherein the first and second wires extend between the first and second capacitive structures, and wherein individual capacitive values of the first and second capacitive structures combine to yield the predefined capacitance value.

6. The integrated circuit of claim 5, wherein the individual capacitive values are different.

7. The integrated circuit of claim 1, wherein the first, second, third, and fourth wires are disposed on different respective metal layers in the integrated circuit, and wherein the first, second, third, and fourth wires all overlap each other in a direction perpendicular to the different respective metal layers.

8. The integrated circuit of claim 7, wherein the first wire is disposed on a first metal layer, the second wire is disposed on a second metal layer directly neighboring the first metal layer, the third wire is disposed on a third metal layer directly neighboring the second metal layer, and the fourth wire is disposed on a fourth metal layer directly neighboring the second metal layer.

9. The integrated circuit of claim 1, wherein at least one of: (i) the first wire is disposed on a same metal layer as the second wire and (ii) the third wire is disposed on a same metal layer as the fourth wire.

10. The integrated circuit of claim 1, wherein the transmission line and an input of the buffer are not coupled to any discrete capacitors.

11. The integrated circuit of claim 1, wherein the predefined capacitance value is based on a frequency of the differential clock to be transmitted on the transmission line.

12. A circuit, comprising:
a clock generator comprising an oscillator coupled to an inductor, wherein the oscillator is configured to output a first signal of a differential clock;
a buffer; and
a transmission line configured to transmit the first signal of the differential clock from the oscillator to the buffer, the transmission line comprising:
a first wire coupled to the oscillator, wherein the first wire is configured to transmit the first signal,
a second wire coupled to the buffer, wherein the second wire is configured to receive the first signal of the differential clock,
a third wire coupled at respective ends to respective first vias, wherein the respective first vias are coupled to the first wire, and wherein the third wire is disposed in a different metal layer in the circuit than the first wire, and
a fourth wire coupled at respective ends to respective second vias, wherein the respective second vias are coupled to the second wire, and wherein the fourth wire is disposed in a different metal layer in the circuit than the second wire,
wherein the first, second, third, and fourth wires are arranged in the circuit to form a capacitor with a predefined capacitance value.

13. The circuit of claim 12, wherein the transmission line does not include any buffers between an output of the oscillator and an input of the buffer, wherein length of the transmission line is at least 100 microns, and wherein the buffer is only capacitively coupled to the clock generator.

14. The circuit of claim 12, further comprising:
a SerDes containing the buffer, wherein the buffer comprises a level shifter and wherein the clock generator is in a first voltage domain of the circuit and the SerDes is in a second voltage domain of the circuit, wherein the level shifter is configured to convert the differential clock from the first voltage domain to the second voltage domain.

15. The circuit of claim 14, further comprising:
a clock distribution network coupled to an output of the SerDes, wherein the clock distribution network is configured to distribute the converted differential clock to logic circuitry in the circuit.

16. The circuit of claim 12, wherein the transmission line further comprises:
a first capacitive structure comprising the third and fourth wires; and
a second capacitive structure comprising:
a fifth wire coupled at respective ends to respective third vias, wherein the respective third vias are coupled to the first wire, and wherein the fifth wire is disposed in a different metal layer in the circuit than the first wire; and
a sixth wire coupled at respective ends to respective fourth vias, wherein the respective fourth vias are coupled to the second wire, and wherein the sixth wire is disposed in a different metal layer in the circuit than the second wire,
wherein the first and second wires extend between the first and second capacitive structures, and wherein individual capacitive values of the first and second capacitive structures combine to yield the predefined capacitance value.

17. The circuit of claim 16, wherein the individual capacitive values are different.

18. The circuit of claim 12, wherein the first, second, third, and fourth wires are disposed on different respective metal layers in the circuit, and wherein the first, second, third, and fourth wires all overlap each other in a direction perpendicular to the different respective metal layers.

19. The circuit of claim 18, wherein the first wire is disposed on a first metal layer, the second wire is disposed on a second metal layer directly neighboring the first metal layer, the third wire is disposed on a third metal layer directly neighboring the second metal layer, and the fourth wire is disposed on a fourth metal layer directly neighboring the second metal layer.

20. A processing system, comprising:
a clock generator comprising an oscillator coupled to an inductor, wherein the oscillator is configured to output a first signal of a differential clock;
a buffer; and
a transmission line configured to transmit the first signal of the differential clock from the oscillator to the buffer, the transmission line comprising:
a first wire coupled to the oscillator, wherein the first wire is configured to transmit the first signal,
a second wire coupled to the buffer, wherein the second wire is configured to receive the first signal of the differential clock,
a third wire coupled at respective ends to respective first vias, wherein the respective first vias are coupled to the first wire, and wherein the third wire is disposed in a different metal layer in the circuit than the first wire, and
a fourth wire coupled at respective ends to respective second vias, wherein the respective second vias are coupled to the second wire, and wherein the fourth wire is disposed in a different metal layer in the circuit than the second wire, wherein the first, second, third, and fourth wires are arranged in the circuit to form a capacitor with a predefined capacitance value.

\* \* \* \* \*